United States Patent [19]

Ajima et al.

[11] Patent Number: 4,515,642
[45] Date of Patent: May 7, 1985

[54] METHOD OF FORMING DEEP ALUMINUM DOPED SILICON BY IMPLANTING AL AND SI IONS THROUGH ALUMINA LAYER AND DEVICE FORMED THEREBY

[75] Inventors: Takashi Ajima, Kamakura; Jiro Ohshima, Kawasaki; Yutaka Koshino, Yokosuka, all of Japan

[73] Assignee: Tokyo Shibaura Denki Kabushiki Kaisha, Kawasaki, Japan

[21] Appl. No.: 525,484

[22] Filed: Aug. 22, 1983

[30] Foreign Application Priority Data

Aug. 23, 1982 [JP] Japan ................. 57-145980

[51] Int. Cl.³ .......................................... H01L 17/00
[52] U.S. Cl. ................................. 148/1.5; 29/576 B; 29/576 T; 148/187; 357/63; 357/91
[58] Field of Search ............... 148/1.5, 187; 29/576 B, 29/576 T; 357/91, 63

[56] References Cited

U.S. PATENT DOCUMENTS

| | | | |
|---|---|---|---|
| 3,589,949 | 6/1971 | Nelson | 148/1.5 |
| 4,111,719 | 9/1978 | Mader et al. | 148/1.5 |
| 4,295,898 | 10/1981 | Yoshida et al. | 148/1.5 |
| 4,332,627 | 6/1982 | Schmitt et al. | 148/1.5 |
| 4,426,234 | 1/1984 | Ohshima et al. | 148/1.5 |
| 4,466,839 | 8/1984 | Dathe et al. | 148/1.5 |

OTHER PUBLICATIONS

Chu et al., in Ion Implantation in Semiconductors, ed. Crowder, Plenum, N.Y., 1974.
Tsaur et al., J. Appl. Phys., 54, (1983), 6336.
Brown et al., J. Appl. Phys., 53, (1982), 8793.
Schmitt et al., IBM-TDB, 22, (1980), 4601.
Edel et al., IBM-TDB, 13, (1970), 632.

*Primary Examiner*—Upendra Roy
*Attorney, Agent, or Firm*—Schwartz, Jeffery, Schwaab, Mack, Blumenthal & Koch

[57] ABSTRACT

In a method of producing a semiconductor device, an alumina layer is formed directly on a principal surface of a silicon substrate; aluminum and silicon are ion-implanted through the alumina layer into said substrate; and the substrate is thereafter annealed. The ion-implanted silicon yields better crystalline structure and increases the solid solubility limit of aluminum.

8 Claims, 11 Drawing Figures

METHOD OF FORMING DEEP ALUMINUM DOPED SILICON BY IMPLANTING AL AND SI IONS THROUGH ALUMINA LAYER AND DEVICE FORMED THEREBY

BACKGROUND OF THE INVENTION

The present invention relates to a method of producing a semiconductor device, and more particularly to diffusion of aluminum for forming a deep PN junction.

Among P-type impurities for silicon Si, aluminum Al has the greatest diffusion coefficient D. For instance, at 1200° C., $$\sqrt{D} \approx 2.5 \, \mu m/\sqrt{hr}$$

where hr represents time (hours). Here, the diffusion coefficient is expressed by its square root as is usual to facilitate related calculations. This value is about 3.8 times that of boron B. For this reason, aluminum is frequently used to form a P-type region having a depth of several tens $\mu m$.

To form a P-type region, aluminum is introduced into silicon crystalline structure by one of several various methods of introduction, and is then diffused by one of several various methods of diffusion. Known methods of introducing aluminum into silicon crystalline structure include the crucible method (FIG. 1A), the evaporation method (FIG. 1B) and ion-implantation (FIG. 1C). Known methods of diffusing aluminum include the closed tube diffusion method (FIG. 1A) and the vacuum diffusion method (FIG. 1D).

These methods of introducing aluminum however had various restrictions or drawbacks. With the crucible method, the vapor pressure and surface condition of aluminum vary depending on the temperature and the pressure, so that control of concentration is difficult. According to the evaporation method, aluminum is deposited on a thin-film of poly-silicon or the like which is formed on the silicon substrate. The use of the poly-silicon film is to prevent alloying of aluminum and silicon. This method is also associated with a difficulty in control of concentration. With the method of the ion-implantation, accurate control of the amount of the introduced impurity is possible, but introduction of aluminum in an amount over the solid solubility limit is not possible, so that the application of the method is restricted to low concentration diffusion (up to $10^{17}$ cm$^{-3}$).

The closed tube diffusion method and the vacuum diffusion method have a disadvantage in that they require special installation and skill, and the process is complicated.

SUMMARY OF THE INVENTION

An object of the invention is to provide a method of producing a semiconductor device with which aluminum can be introduced at a high concentration and yet the concentration of aluminum can be accurately controlled.

Another object of the invention is to provide a method which yields a silicon substrate having a superior crystalline structure.

According to the invention, there is provided a method of producing a semiconductor device comprising the steps of:

forming an alumina layer directly on a principal surface of a silicon substrate;

ion-implanting aluminum through said alumina layer into said substrate;

ion-implanting silicon through said alumina layer into said substrate; and annealing said substrate into which aluminum and silicon have been ion-implanted.

DESCRIPTION OF THE EMBODIMENTS

FIGS. 2A–2D are schematic illustrations of the various steps of the method of producing a semiconductor device according to the invention.

First, a silicon wafer 20 having a diameter of 76 mm, a thickness of 800 82 m, and the crystalline axis N (111) is prepared. This wafer 20 is doped with phospher P to form an N-type substrate and has a specific resistance $\rho = 100 \sim 150 \, \Omega\text{-cm}$.

Figure 1A:
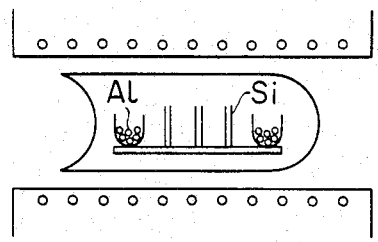
FIGS. 1A–1D show various conventional methods of introducing and diffusing aluminum.
Figure 2A:
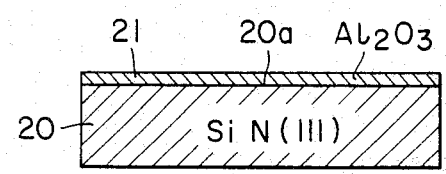
FIGS. 2A–2D show various steps in the method according to the invention.
Figure 1B:
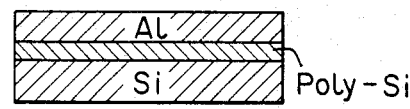

Then, as shown in FIG. 2A, a layer or film 21 of alumina $Al_2O_3$ having a thickness of about 1000 Å is formed directly on a principal plane 20a of the wafer 20, by means of spattering. Chemical vapor deposition (CVD) may alternatively be used to form the film 21.

Figure 2B:
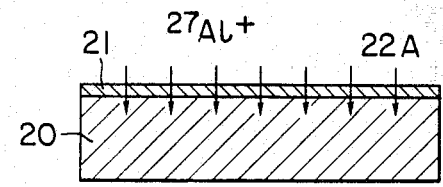
Figure 1C:
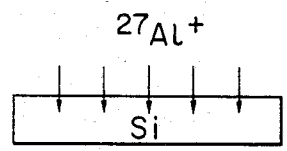

Next, as shown in FIG. 2B, aluminum 22A is ion-implanted through the alumina layer 21 into the wafer 20, with an acceleration voltage of 150 keV. The dosage is within a range of $5 \times 10^{14} - 5 \times 10^{15}$ cm$^{-2}$. It should be noted that the smallest value in the dosage range, i.e., $5 \times 10^{14}$ cm$^{-2}$, with the acceleration voltage of 150 keV results in the peak concentration of about $5 \times 10^{19}$ cm$^{-3}$, which exceeds the normal solubility limit $2 \times 10^{19}$ cm$^{-3}$.

Figure 2C:
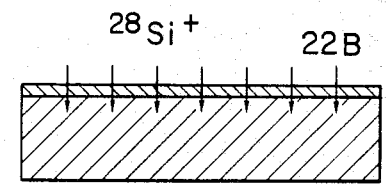
Figure 1D:
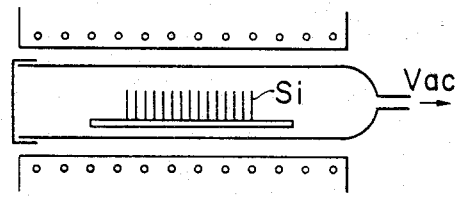

Next, as shown in FIG. 2C, silicon 22B is ion-implanted through the alumina layer 21 into the wafer 20, with the acceleration voltage of 150 keV. The dosage is within a range of $10^{13} - 10^{16}$ cm$^{-2}$.

Since aluminum and silicon have substantially the same mass, concentration peak positions (depths) will roughly coincide with each other if the acceleration voltages are identical.

The order of ion-implantation of aluminum and silicon is not material and can be reversed.

Figure 2D:
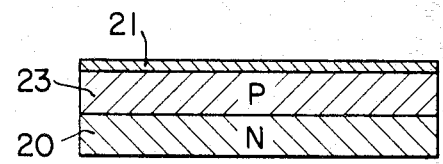

The wafer 20 with the aluminum and silicon ion-implanted is thereafter annealed. This annealing is done by means of open-tube diffusion wherein the wafer is placed in the atmosphere of nitrogen $N_2$ gas at a temperature of about 1200° C. for about 60 hours. (FIG. 2D)

The ion-implanted silicon has been found to yield a better crystalline structure and to increase the solid solubility limit of aluminum.

First, when the dosage of silicon is $10^{13}$ cm$^{-2}$ or more (with the acceleration voltage being 150 keV), the resultant crystalline structure is better than if aluminum alone is ion-implanted. This is considered due to reduction by the ion-implanted silicon atoms of the vacancies during recrystallization When the dosage of silicon is $10^{14}$ cm$^{-2}$ or more (with the acceleration voltage being 150 keV) the recovery to crystalline state during annealing occurs at a lower temperature and in a shorter time. This is because the ion-implantation of silicon of a sufficient quantity increases the crystallization temperature, resulting in a driving force for re-crystallization. Moreover, the solid solubility limit is increased. Without the ion-implanted silicon, aluminum would precipitate when its dosage yields a peak concentration exceeding the solid solubility limit. But with the ion-implanted silicon, this is prevented.

Figure 3:
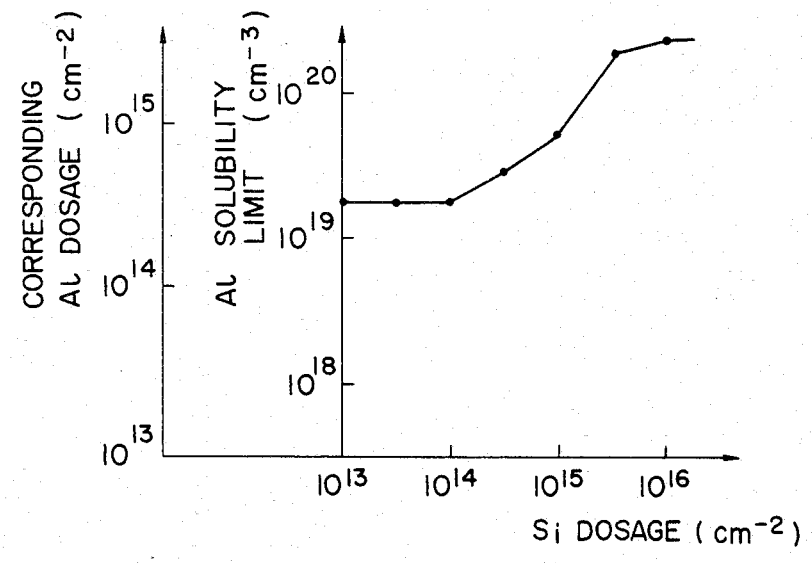
FIG. 3 is a graph showing the increase of solid solubility limit of aluminum.

The solid solubility limit can be determined by means of TEM (transmission electron microscopy) observation for finding crystalline structure and defect concentration in the crystalline structure and in accordance with the dosage and the acceleration voltage (these two factors are related to the peak value of the aluminum concentration). FIG. 3 shows values of the solid solubility limit of aluminum as determined, by the above-described method, for different dosages of the ion-implanted silicon. For instance when the dosage of silicon is $1 \times 10^{15}$ cm$^{-2}$, the aluminum solid solubility limit is increased to $7 \times 10^{19}$ cm$^{-3}$. Similarly, when the silicon dosage is $1 \times 10^{16}$ cm$^{-2}$, the aluminum solid solubility limit is increased to $3 \times 10^{20}$ cm$^{-3}$. These values of the solid solubility limits are much higher than the solid solubility limit attained in the conventional methods.

The dosages beyond the ranges described above may destroy the crystalline structure, and should therefore be avoided.

The wafers produced in accordance with the above-described method have, been found to have surface resistivity $\rho_s$ of 30 $\Omega$/square and the junction depth of about 100 $\mu$m, when the aluminum dosage is $5 \times 10^{14}$ cm$^{-2}$, and the silicon dosage is $1 \times 10^{15}$ cm$^{-2}$.

Figure 4A:
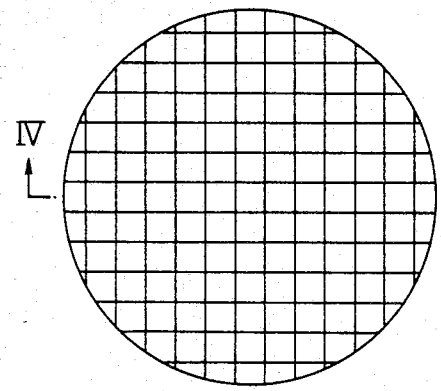
FIGS. 4A and 4B show a method for testing the effect of preventing out diffusion.
Figure 4B:
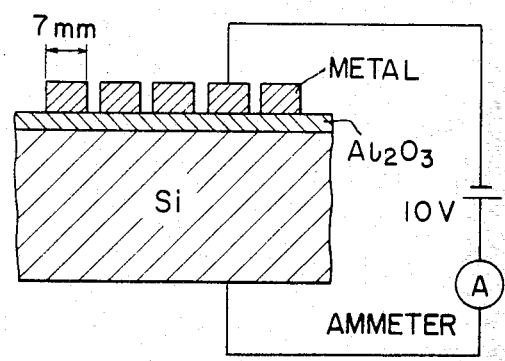

It has also been confirmed that the silicon prevents out diffusion of aluminum within the alumina layer. The manner of experiments carried out for the confirmation is as follows. Samples of silicon substrates with alumina layer of 1000 Å in thickness were prepared. The first group of the samples (wafers A) had their alumina layer covered with aluminum alone, while a second group of the samples (wafers B) had their alumina layer covered with aluminum-silicon alloy. Both groups of wafers were then annealed in a nitrogen N$_2$ gas atmosphere at 1200° C. for 60 hours. Thereafter, the metal layer (aluminum layer or aluminum-silicon alloy layer) was divided into square portions 7 mm on a side and leak current was measured (FIGS. 4A, 4B). The bias voltage of 10 V was applied, and those with the leak current of 1 $\mu$A or more were counted as defective.

78% of the wafers of group A were non-defective. In contrast, 98% of the wafers of group B were non-defective. The comparison shows the silicon prevents or restricts diffusion of aluminum in the alumina layer. This in turn improves the capability of alumina layer of preventing out diffusion of ion-implanted aluminum.

What is claimed is:

1. A method of producing a semiconductor device comprising the steps of:
   forming an alumina layer directly on a principal surface of a silicon substrate;
   ion-implanting aluminum through said alumina layer into said substrate;
   ion-implanting silicon through said alumina layer into said substrate; and
   annealing said substrate into which aluminum and silicon have been ion-implanted.

2. A method of claim 1, wherein the acceleration voltage used in the ion-implantation of aluminum and silicon is not more than 150 keV.

3. A method of claim 1, wherein the acceleration voltage used for the ion-implantation of silicon is about 150 keV and the dosage of silicon by the ion-implantation is within the range of $10^{13} - 10^{16}$ cm$^{-2}$.

4. A method of claim 1, wherein the annealing comprises open tube diffusion process.

5. A method of claim 2, wherein the thickness of the alumina layer formed is not more than 1000 Å.

6. A method of claim 3, wherein the dosage of silicon by the ion-implantation is within the range of $10^{14} - 10^{16}$ cm$^{-2}$.

7. A method of claim 4, wherein the annealing by the open tube diffusion comprises placing the wafer in a nitrogen gas atmosphere at a temperature of about 1200° C. for about 60 hours.

8. A method of claim 6, wherein the acceleration voltage used for the ion-implantation of aluminum is about 150 keV and the dosage of aluminum by the ion-implantation is within the range of $5 \times 10^{14} - 5 \times 10^{15}$ cm$^{-2}$.

* * * * *